:::

United States Patent
Ikegami et al.

(10) Patent No.: US 8,564,191 B2
(45) Date of Patent: Oct. 22, 2013

(54) LIGHT EMITTING SUBSTRATE HAVING PHOTONIC CRYSTAL STRUCTURE AND IMAGE DISPLAY APPARATUS INCLUDING THE SAME

(75) Inventors: Tomoyuki Ikegami, Hiratsuka (JP); Tatsundo Kawai, Tokyo (JP); Tomoyuki Tamura, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 207 days.

(21) Appl. No.: 13/152,568

(22) Filed: Jun. 3, 2011

(65) Prior Publication Data

US 2011/0304265 A1 Dec. 15, 2011

(30) Foreign Application Priority Data

Jun. 10, 2010 (JP) ................. 2010-133288

(51) Int. Cl.
*H01L 51/50* (2006.01)
*H01L 33/00* (2010.01)

(52) U.S. Cl.
USPC .......................................... 313/504; 257/98

(58) Field of Classification Search
None
See application file for complete search history.

(56) References Cited

U.S. PATENT DOCUMENTS

2010/0090584 A1   4/2010   Kawai et al.

FOREIGN PATENT DOCUMENTS

JP   11-283751 A   10/1999
JP   2010-114069 A   5/2010

OTHER PUBLICATIONS

Kobayashi et al., "Basic of Phosphor and New Developments According to Applications", Nov. 2005, pp. 175-182 published by Johokiko Co., Ltd.
Masaya Notomi, "Photonic Crystal Technology and its Applications", (supervised by Shojiro Kawakami, CMC Publishing Co., Ltd.).

*Primary Examiner* — Britt D Hanley
(74) *Attorney, Agent, or Firm* — Canon U.S.A., Inc. IP Division

(57) ABSTRACT

A light emitting substrate configured to enhance luminance of an image display apparatus is disclosed. The light emitting substrate includes a transparent substrate, a photonic crystal structure, a transparent anode, a light emitting layer having a diffuse reflectance of 0.04% or less and having a side reflecting member at a side thereof. The photonic crystal structure, the transparent anode, and the light emitting layer are successively laminated in this order on the transparent substrate. The light emitting substrate satisfies the following Condition 1 or Condition 2:

Condition 1: $95 \leq c$, and $40 \leq a < 100$

Condition 2: $85 \leq c < 95$, and $80 \leq a < 100$ where a is a relative area of the photonic crystal structure to that of the light emitting layer, and c is a reflectance of the side reflecting member.

10 Claims, 11 Drawing Sheets

LIGHT EMITTING SUBSTRATE HAVING PHOTONIC CRYSTAL STRUCTURE AND IMAGE DISPLAY APPARATUS INCLUDING THE SAME

BACKGROUND OF THE INVENTION

1. Field of the Invention

The present invention relates to an image display apparatus.

2. Description of the Related Art

Image display apparatuses such as liquid crystal display (LCD), plasma display panel (PDP), organic electroluminescence display (OLED), and field emission display (FED) are known. These image display apparatuses are required to have high luminance. Japanese Patent Application Laid-Open No. 11-283751 discusses a technique purported to improve light extraction efficiency of the OLED by using a diffraction grating or a zone plate.

The inventors of the present invention, however, found that a structure where the diffraction grating is arranged all over the light emitting layer of the OLED, as discussed in Japanese Patent Application Laid-Open No. 11-283751, cannot provide adequate luminance.

SUMMARY OF THE INVENTION

An object of the present invention is to provide a light emitting substrate capable of enhancing luminance of an image display apparatus, and an image display apparatus with improved luminance.

According to an aspect of the present invention, a light emitting substrate, includes a transparent substrate, a photonic crystal structure, a transparent anode, a light emitting layer having a diffuse reflectance of 0.04% or less and having a side reflecting member at the side thereof, wherein the photonic crystal structure, the transparent anode, and the light emitting layer are successively laminated in this order on the transparent substrate, wherein the light emitting substrate satisfies the following Condition 1 or Condition 2:

Condition 1: $95 \leq c$, and $40 \leq a < 100$
Condition 2: $85 \leq c < 95$, and $80 \leq a < 100$ where a (%) is a relative area of the photonic crystal structure to that of the light emitting layer, and c (%) is a reflectance of the side reflecting member.

The present invention provides a light emitting substrate and an image display apparatus having improved luminance.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

DESCRIPTION OF THE EMBODIMENTS

Figure 1A:
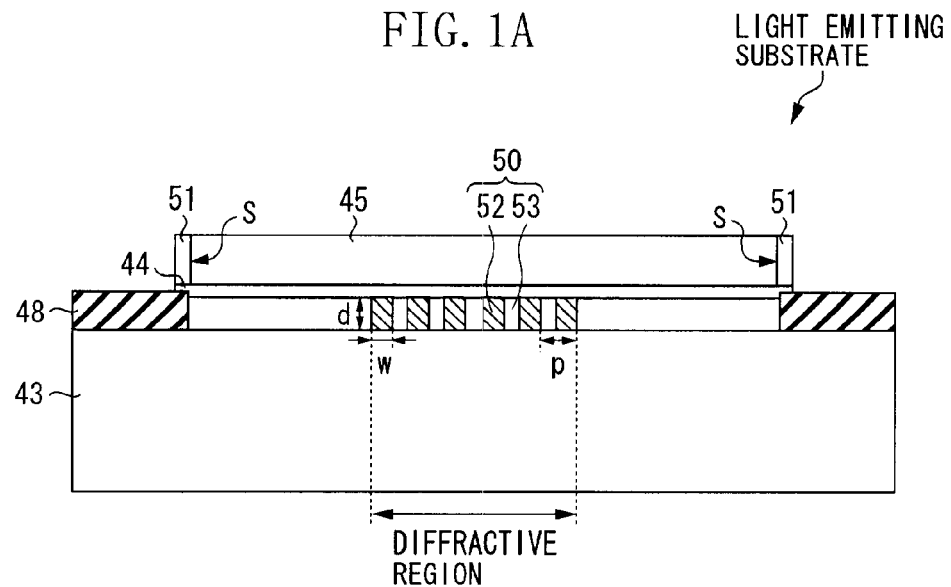
FIGS. 1A and 1B are schematic diagrams illustrating cross sections of a light emitting substrate.

Various exemplary embodiments, features, and aspects of the invention will be described in detail below with reference to the drawings.

Exemplary embodiments of the present invention are specifically described using an example of a field emission display. The present invention is not limited to the field emission display (FED), and is applicable to other image display apparatus such as an organic electroluminescence display (OLED) and cathode ray tube display (CRT). The present invention is in particular applicable to FED and OLED devices. An exemplary embodiment of the present invention is described below using an example of FED.

The same reference numerals throughout the drawings refer to the same members unless specified otherwise. The members are illustrated in sizes different from actual ones for ease of illustration, unless expressly stated otherwise.

Figure 2:
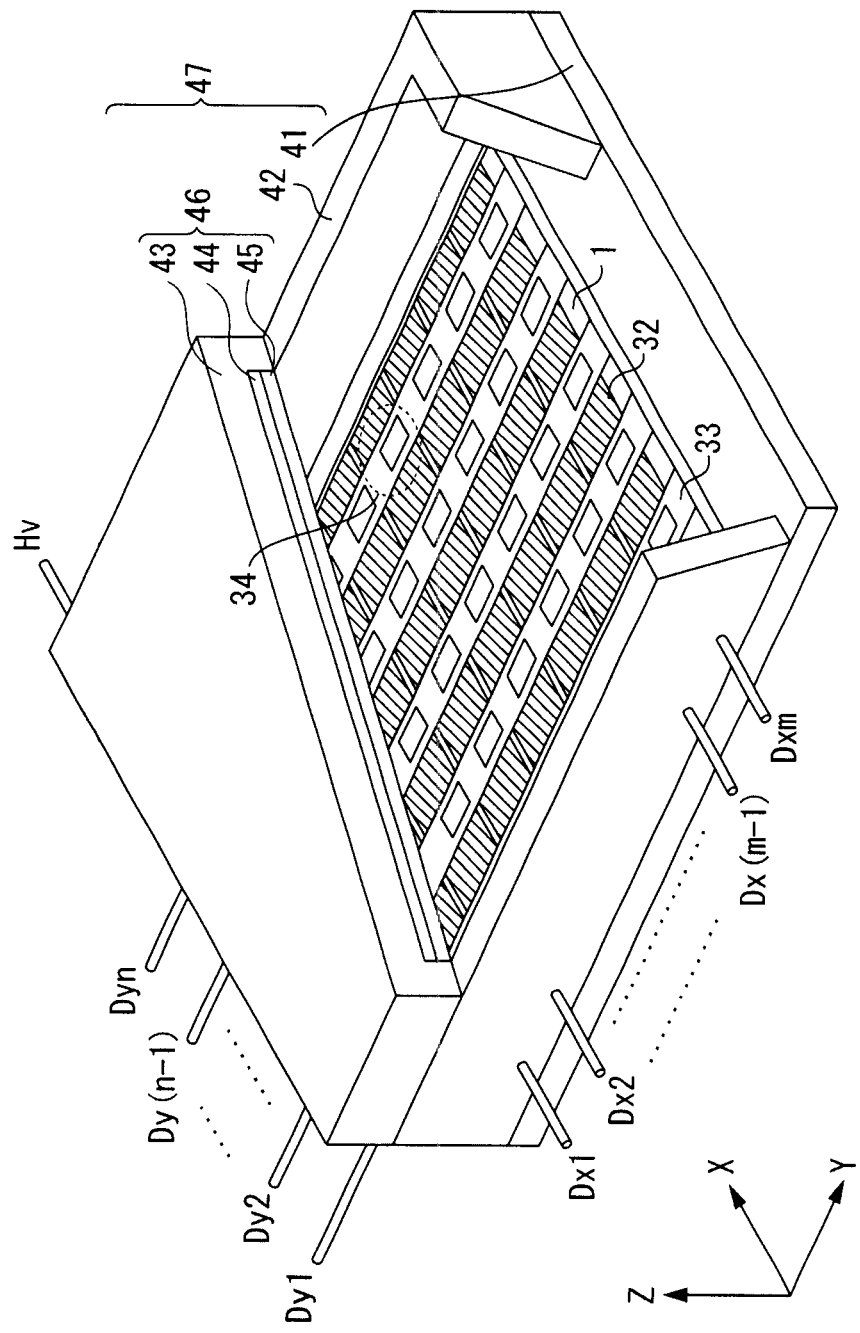
FIG. 2 is a schematic perspective view illustrating a structure of an image display apparatus.

A structure of an FED device is described with reference to FIG. 2. FIG. 2 is a schematic perspective view illustrating a structure of an FED, with a part thereof being cut away to illustrate an inner structure thereof. The FED includes a substrate 1 having a plurality (m) of scan lines 32, a plurality (n) of modulation lines 33, and a plurality of electron-emitter devices 34 arranged thereon.

The substrate 1 is fixedly secured to a rear plate 41. Inner surface of a transparent substrate 43, an anode 44 and a phosphor layer 45 serving as a light emitting layer are disposed facing substrate 1. The anode 44 and the phosphor layer 45 are laminated. The phosphor layer 45 is generally composed of a plurality of phosphor layers 45 as described in more detail with reference to FIGS. 1A and 1B. Between the phosphor layers 45, known black matrices are interposed.

A face plate 46 includes the transparent substrate 43, the anode 44, and the phosphor layer 45. A support frame 42 contained between the rear plate 41 and face plate 46 is bonded to the rear and face plates 41 and 46 using a bonding material such as glass frit. The face plate 46, the support frame 42, and the rear plate 41 constitute a hermetic container 47. The hermetic container 47 has an inner space that is maintained at a pressure (preferably about $10^{-7}$ Pa) lower than the atmospheric pressure. The face plate 46 is a light emitting substrate of the FED.

In the present exemplary embodiment, the substrate 1 and the rear plate 41 are separate members, but in a case where the rear plate 41 has sufficient rigidity by itself, the rear plate 41 may also function as the substrate 1, and thus the substrate 1 can be omitted. Alternatively, a spacer (not illustrated) may be interposed as a supporting member between the face plate 46 and the rear plate 41, so that the hermetic container 47 has sufficient rigidity against atmospheric pressure.

The m scan lines 32 are connected with corresponding terminals (terminal Dx1, Dx2, .... Dxm) respectively, and the n modulation lines 33 are connected with corresponding terminals (terminals Dy1, Dy2, .... Dyn) respectively (m and n each are a positive integer).

The m scan lines 32 intersect with the n modulation lines 33, and the intersections are each provided with an interlayer insulator (not illustrated) to electrically insulate the lines from one another. Each of the electron-emitter devices 34 is connected to one of the m scan lines 32 and one of the n modulation lines 33.

A high pressure terminal Hv is connected to the anode 44, so that a direct-current (DC) voltage ranging from 5 kV to 15 kV for example is supplied to the anode 44 through the high pressure terminal Hv. The voltage, as an accelerating voltage, provides sufficient energy to electrons emitted from the electron-emitter devices 34 to cause the phosphor layers 45 to emit light.

FIG. 1A is a schematic cross sectional diagram illustrating part (a part corresponding to one pixel) of the face plate 46 serving as a light emitting substrate. In FIG. 1A, the electrons emitted from the electron-emitter devices 34 in FIG. 2 are incident on the phosphor layer 45 in the downward direction in FIG. 1A. Accordingly, the phosphor layer 45 in FIG. 2 is illustrated upside down as compared with that in FIG. 1A.

The transparent substrate 43 has photonic crystal structures 50 provided thereon to extract light beams emitted from the phosphor layers 45 serving as light emitting layers to the outside of the transparent substrate 43. The transparent substrate 43 can be made of a material transparent to visible light and highly insulating, such as a sheet glass made of soda-lime glass. The detailed structure of the photonic crystal structures 50 will be described below.

The anode 44 is a transparent electrode made of indium tin oxide (ITO) for example, and is disposed on the photonic crystal structures 50 to sandwich the photonic crystal structures 50 between the transparent substrate 43 and the anode 44. The phosphor layer 45 is disposed on the anode 44 to sandwich the photonic crystal structures 50 and the anode 44 between the transparent substrate 43 and the phosphor layer 45. The detailed structure of the phosphor layer 45 will be described below.

In the present exemplary embodiment, between the adjacent photonic crystal structures 50, known black matrices 48 are disposed. The black matrices 48 prevent mixture of colors between pixels and diffuse reflection of light beams. In the present exemplary embodiment, the anode 44 covers the entire photonic crystal structures 50 and part of the black matrices 48. The effects of the present invention, however, can be obtained without the black matrices 48, and the black matrices 48 are not essential.

The anode 44 is required to cover at least a diffractive region, which will be described below, of the photonic crystal structures 50, and to be larger than the photonic crystal structures 50. Accordingly, the anode 44 does not have to be divided for each pixel, but may be one transparent conductive film covering the photonic crystal structure 50 corresponding to one pixel.

In the present exemplary embodiment, the black matrix 48 is provided with rectangular openings where the photonic crystal structures 50 are located. The openings each preferably have the short side of 50 μm to 300 μm in length and the long side of 1 to 3 times the length of the short side.

The phosphor layer 45 has a region area approximately the same as that of one opening provided by the pattern of the black matrices 48. The term "region area" of the photonic crystal structures 50 as used herein refers to an area of a surface where the photonic crystal structures 50 (more specifically, the diffractive region of the photonic crystal structures 50) is in contact with the transparent substrate 43.

The term "region area" of the phosphor layer 45 refers to an area of a surface where the phosphor layer 45 is in contact with the anode 44, but when a black matrix is used, the area can be considered to be equal to the opening area of the black matrix. The side face S of the phosphor layer 45 is provided with a side reflecting member 51 in contact therewith, which will be described below in detail.

(Light Emitting Layer)

The phosphor layer 45 serving as a light emitting layer of the present invention preferably is a thin film phosphor layer having low optical dispersion (little propagation loss of light flux within the light emitting layer). The thin film phosphor layer provides an advantageous effect to embodiments of the present invention.

The term "thin film phosphor layer" as used herein refers to a phosphor layer directly deposited on the transparent substrate 43 by a vacuum process using a sputtering technique or an electron beam evaporation technique. More specifically, for example, the thin film phosphor layer can be composed of a layer obtained by growing a mixture of a material as a host crystal and a material as a base for light emission points on the transparent substrate 43 in an amorphous state and heating the mixture to crystallize on the transparent substrate 43.

Examples of the material as a host crystal include oxides such as $Y_2O_3$, $Y_2O_2S$, and $Gd_2O_3$, and sulfides such as ZnS and $SrGa_2S_4$. Examples of the material as a base for light emission point (activator) include Eu, Cu, Al, Ag, and Cl.

The growth of the materials in an amorphous state can be achieved by a vacuum deposition technique or molecular beam epitaxy technique, in addition to the above-described sputtering technique and electron beam deposition technique. Examples of the heat treatment include thermal annealing in a high temperature furnace and thermal annealing using laser beam.

A nanoparticle fluorescent layer can preferably be used because the nanoparticle fluorescent layer has low optical dispersion similar to that of the thin film phosphor layer. The term "nanoparticle fluorescent material" refers to phosphor material having a particle size equal to or less than the emission wavelength (on the order of several hundred nm) of the phosphor. The nanoparticle fluorescent material can be obtained by bottom-up approach that controls particle size of phosphor by generating and growing of nuclei in a phosphor liquid through chemical reaction, or top-down approach that grinds bulk phosphor.

The nanoparticle fluorescent layer is featured by low optical dispersion as compared with that of a phosphor layer for CRTs containing phosphor particles of a size of a few μm, and sufficient emission centers for penetration depth of an excitation ray. More details of the thin film phosphor layer and nanoparticle fluorescent layer are described, for example, in a book written by Hiroshi Kobayashi et al., "Basic of Phosphor and New Developments According to Applications", published by JOHOKIKO Co., Ltd., November 2005.

The term "low optical dispersion" as used herein refers to a diffuse reflectance of less than 0.04%. The diffuse reflectance (reflection of light at many angles rather than at one angle as in the case of specular reflection) of the phosphor layer 45 is measured according to JIS Z 8722: 2009, 5.3, which is an industrial standard for a method of measuring reflection of an object. Specifically, a light source is positioned in the direction at an angle of 45°±2° relative to a normal line to a surface of an object, and the light source emits a light flux to illuminate the surface. The light flux is received by a receiver positioned in the direction at an angle of 10° or less relative to the normal line of the surface. The intensity of the received light flux is compared with that received from a standard white surface in a measurement system under the same condition, to calculate a relative intensity as a diffuse reflectance.

The standard white surface herein refers to a white surface used as a standard in measuring spectral reflectance and calibrated for spectral reflectance as reference. The standard white surface approximately uniformly has a reflectance of almost 100% in all of the directions, and is made of white $BaSO_4$.

The above-described measurement may be performed using a halogen light source (e.g., MHAA-100W-100V, by MORITEX Corporation) for example as a light source. The receiver may be a spectral radiometer (e.g., SR-UL1 by TOPCON TECHNOHOUSE Corporation and the standard white surface may be a standard white board (WS-3, TOPCON TECHNOHOUSE Corporation).

A phosphor material for red color used in the present invention may contain an oxide such as $Y_2O_3$ and $Gd_2O_3$ or a sulfide such as $Y_2O_2S$ as a host and an activator metal such as Eu and Zn added thereto. The material may contain ZnS:Cu, Al, or $SrGa_2S_4$:Eu for green color, and ZnS:Ag, or Cl for blue color.

The nanoparticle fluorescent material and the nanoparticle fluorescent layer can be manufactured as follows, for example. The nanoparticle fluorescent material can be manufactured with phosphor material by a spray pyrolysis technique, solid phase technique based on top-down approach, liquid-phase technique based on bottom-up approach, or gas phase technique.

The spray pyrolysis technique involves spraying a liquid of phosphor material as droplets, heating the droplets in a carrier gas by a heater, evaporation of a solvent in the liquid, and thermal decomposition of the material, to obtain the nanoparticle fluorescent material. The solid phase technique involves mixing of powder materials, heating and firing the mixture at high temperature, grinding the resultant using a ball mill into fine particles, to obtain the nanoparticle fluorescent material.

The liquid-phase technique uses liquid phase reaction such as coprecipitation method and sol-gel method to obtain the nanoparticle fluorescent material. The gas phase technique uses liquid phase reaction to obtain the nanoparticle fluorescent material wherein the phosphor material dispersed in a carrier gas is rapidly heated when passing a heating region heated by a heat source such as plasma, and is then cooled to form the nanoparticle fluorescent material. One of the above techniques can be selectively used as needed.

The nanoparticle fluorescent layer is formed by dispersing the nanoparticle fluorescent material in a solvent to prepare nanoparticle fluorescent material dispersed liquid. The dispersion liquid is coated to a surface where a film is to be formed, using inkjet printing, spin coating, or bar coating technique. Subsequently, the coating is dried and/or fired to evaporate the solvent, resulting in formation of the nanoparticle fluorescent layer.

The side face of the phosphor layer 45 may desirably have specularity. The side of the phosphor layer 45 may desirably be arranged substantially perpendicular to the transparent substrate 43.

The side face of the phosphor layer 45 herein refers to the face of the phosphor layer 45, in the faces of the phosphor layer 45, that is disposed perpendicular to the face in contact with the photonic crystal structures 50 (a surface of the transparent substrate 43). In FIG. 1A, the side face of the phosphor layer 45 is marked by the symbol S.

The side face S of the phosphor layer 45 can be formed by, for example, protecting the pixel region (the region to be remained) of the phosphor layer by photoresist masking, and removing the region around the pixel region by etching. The side face S can have a shape as desired by selecting conditions and approaches of the etching.

(Side Reflecting Member)

In the present invention, a side reflecting member 51 may desirably be provided adjacent to the side face S of the phosphor layer 45. The side reflecting member 51 may be made of silver or aluminum, for example. The side reflecting member 51 may desirably be made of silver having high reflectance with a little loss of light flux. The side reflecting member 51 desirably has a reflectance of 85% or more.

In the present invention, the reflectance of the side reflecting member 51 can be obtained by measuring a specular reflection component in the direction at an angle of 5° relative to a sample surface that is formed by deposition of the material of the side reflecting member 51 on a glass substrate.

The specular reflection component herein refers to a component of light flux that is reflected at an angle equal to the incident angle of the light flux, among the light flux components reflected to various angles from a reflecting surface (sample surface). The ratio of reflected light flux intensity between a specular reflection component of a sample and a specular reflection component of a calibrated standard mirror can be obtained as reflectance.

Specifically, a spectrophotometer such as SolidSpec3700 (by Shimadzu Corporation) can be used for the measurement. The side reflecting member 51 can be made by deposition of a material onto the side face S of the phosphor layer 45 prior to the removal process of the resist used for formation of the side face S of the phosphor layer 45.

The side reflecting member 51 is desirably connected to the anode 44. The connection increases controllability of electrical potential of the phosphor layer 45. To obtain the connection, as illustrated in FIG. 1A, at least partially, the side reflecting member 51 can be formed to be laminated on the anode 44.

(Photonic Crystal Structure)

Each of the photonic crystal structure 50 of the present exemplary embodiment partially includes a region (diffractive region) where regions 52 and 53 each made of different materials (the materials constituting the photonic crystal structure) are arranged alternately (see FIG. 1A).

Typically, the photonic crystal structure 50 includes a pattern where regions (fine dots) of a high refractive index material are distributed over a layer of a low refractive index material, or a pattern where regions (fine dots) of a low refractive index material are distributed over a layer of a high refractive index material. In the case of the former pattern, in FIG. 1A, a low refractive index material corresponds to region 53, and a high refractive index material corresponds to region 52. In the case of the latter pattern, the low refractive index material corresponds to region 52, and the high refractive index material corresponds to region 53.

Examples of the high refractive index material include ZrO, $Al_2O_3$, and $TiO_2$, and examples of the low refractive index material include $MgF_2$ and $SiO_2$. The high refractive index material has a refractive index of from 1.7 to 2.6, and the low refractive index material has a refractive index of from 1.3 to 1.6. The difference in refractive index between the high and low refractive index materials may desirably be 0.3 or more.

Figure 1B:
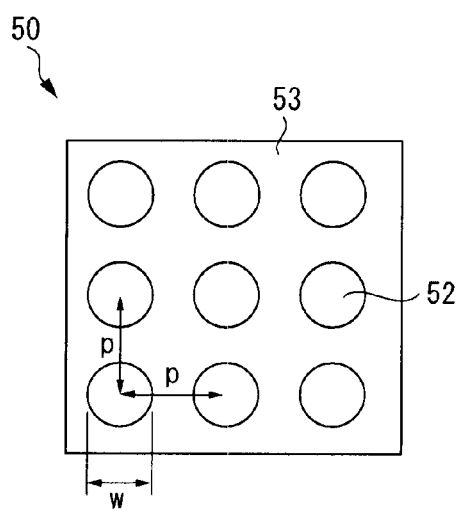

FIG. 1B is a schematic plan view illustrating part of a diffractive region of the photonic crystal structures 50 according to the present invention. The regions (fine dots) 52 of the low refractive index material (or high refractive index material) each are arranged at a pitch p, and have a diameter w. Practically, the pitch is set to range from 300 nm to 3 μm, and the diameter w is set to be 0.2 to 1 times of the pitch p.

The fine dots 52 may be arranged other than in a precise repeating pattern at the pitch p. In arrangements other than in a repeating pattern, the pitch p is referred to as a mean distance between the centers of adjacent dots. In the present exemplary embodiment, the regions (fine dots) 52 of the low refractive index material (or high refractive index material) each have a circular shape in a plan view, but may have a rectangular, ellipsoidal, or other shape.

In the present exemplary embodiment, the transparent anode 44 is provided on the photonic crystal structure 50 (on the side facing the electron-emitter devices 34). The transparent anode 44 may be a transparent conductive film, such as ITO film, ZnO film, and SnO film, and may be made by the sputtering technique for example.

(Light Trapping Mechanism Caused by Total Internal Reflection Of Transparent Substrate)

Figure 3:
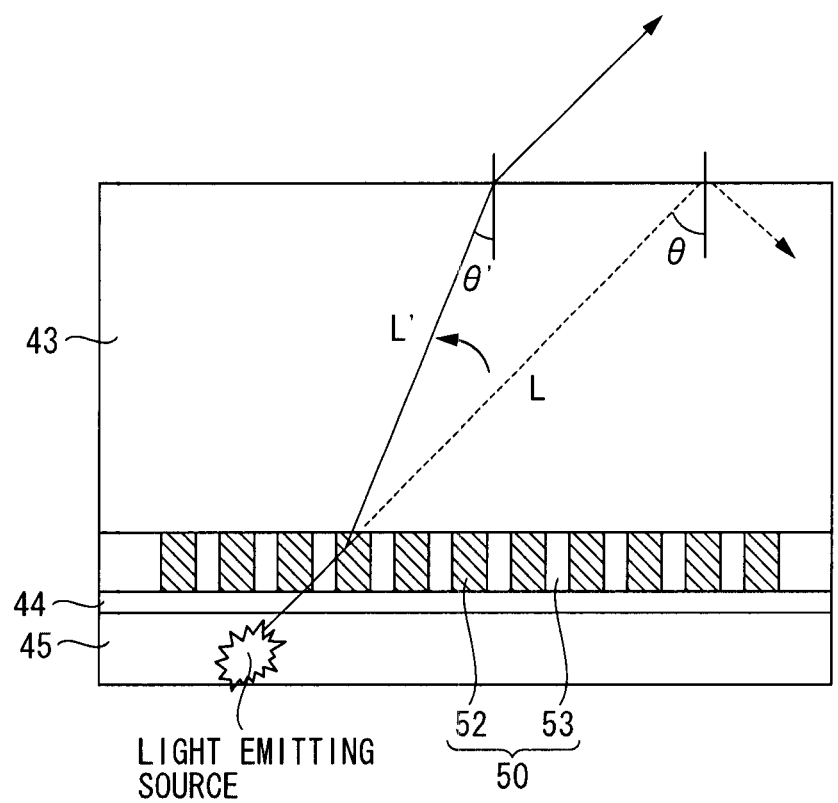
FIG. 3 illustrates effect of a photonic crystal structure.

Operations of the photonic crystal structure 50 are described with reference to FIG. 3, using an example where light is emitted from a light emitting source at part of the phosphor layer 45. The phosphor layer 45 in FIG. 3 is illustrated upside down in FIG. 1B. The function of the photonic crystal structure 50 having a regular pattern is basically due to the diffraction phenomenon of light passing through a diffraction grating.

In FIG. 3, in the case without a photonic crystal structure of the present invention, light flux L (dashed line) entering the substrate 43 from a light emitting source of the phosphor layer 45 at an angle of a critical angle θ or more that is determined by the difference of refraction indices between the substrate 43 and the air is totally reflected within the substrate 43 (by the interface between the substrate 43 and the air) and trapped within the substrate 43.

In contrast, in accordance with an embodiment of the present invention, the light flux L emitted from light emitting source of the phosphor layer 45 to enter the substrate 43 is diffracted by the photonic crystal structure 50 when the light flux enters the substrate 43, changing the light flux L into light flux L' having an angle θ' that is less than the critical angle θ. This structure guides more light from the light emitting source to the outside (into the air) of the substrate 43. Consequently, light-emission luminance from the phosphor layer 45 observed outside of the substrate 43 is improved.

General description of photonic crystal can be found in "Photonic Crystal Technology and its Applications", (supervised by Shojiro Kawakami, CMC Publishing CO., LTD.), for example.

Although the advantageous effect of changing the light flux L into light flux L' having an angle θ' that is less than the critical angle θ, by using the photonic crystal structure 50, is readily evident from the illustration of FIG. 3, the inventors of the present invention studied and found that simple lamination of the photonic crystal structures 50 (the diffractive region, in particular) over the entire phosphor layer 45 does not appropriately provide the above described effect of the photonic crystal structure.

Thus, the present invention provides an image display apparatus that increases effect of the photonic crystal structure 50 and have improved luminance. The basic principle and characteristic structure of the present invention are described below.

(Problem of Spherical Wave)

Characteristics of optical diffraction related to the basic principle of the present exemplary embodiment are described. The diffracting structure such as the photonic crystal structure 50 is more effective with respect to the plane wave incident thereto than spherical wave incident thereto. The reason is described by way of an example with a simple diffraction grating serving as the simplest diffracting structure.

Figure 4A:
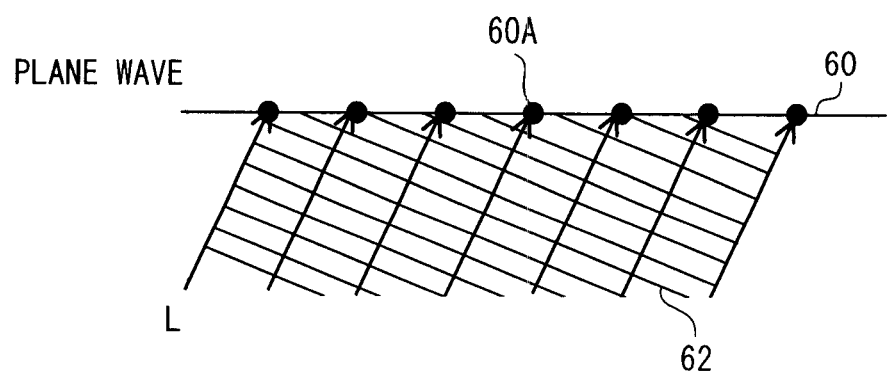
FIGS. 4A and 4B illustrate difference between spherical wave and plane wave incident on a diffraction plane.
Figure 4B:
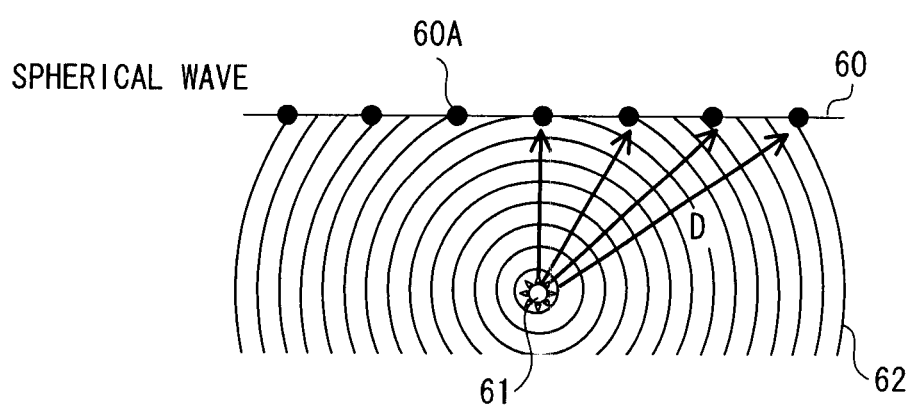

FIGS. 4A and 4B qualitatively illustrate the difference in diffraction phenomenon with the diffraction grating 60 between plane wave incident thereto (FIG. 4A) and spherical wave incident thereto (FIG. 4B). In FIGS. 4A and 4B, a diffraction grating 60 of a simple grating structure has a plane surface, to which components of a light flux L from a light source enter directing to lattice points 60A. A spherical wave entering the plane surface from a point light source 61 generates a surface wave 62.

In FIG. 4A with a plane wave incident on the diffraction grating 60, the plane wave produces surface waves 62 at all the lattice points 60A of the diffraction grating 60 whose phase differences coincide with each other. As a result, the light components output from the diffraction grating 60 exhibit an apparent angular distribution that has an outstanding intensity peak at a predetermined angle.

On the other hand, in FIG. 4B, when a spherical wave is incident on the diffraction grating 60, the surface waves 62 is different from the diffraction grating 60 in shape, and thereby the phases do not match with each other at the lattice points 60A, in particular at the points close to the light source 61. As a result, the directions of constructive interferences between adjacent gratings become non-uniform, and the resultant components of the light output from the diffraction grating 60 exhibit an obscure angular distribution.

Accordingly, when the light flux emitted from the source of the phosphor layer 45 and incident on the photonic crystal structure 50 is in a state of spherical wave, the light flux cannot be efficiently converged by diffraction within the critical angle θ, with part of the light flux trapped within the substrate 43.

In the case with finite light emitting regions in pixels such as those of a display instead of a single point light source as illustrated in FIG. 4B, each of the regions can be regarded as a group of a plurality of fine point light sources. The point light sources are each separated from one another and incoherent with one another. In other words, the light components of the overall pixels have imperfect coherence with one another, and they can be said to be composed of incoherent point light sources.

Accordingly, with respect to the diffraction at the photonic crystal structure 50, the above-described effect of the photonic crystal structure cannot be fully obtained due to the influence of the spherical wave incident thereon from the point light source.

To overcome the problem, a propagation distance of a light flux from the light emitting source to the photonic crystal structures 50 is taken in consideration, so that the problem due to the spherical wave incident on the photonic crystal structure can be reduced. More specifically, even when a light flux from a light source enters the structure as a spherical wave, as a propagation distance thereof becomes longer, the radius of curvature increases. As a result, the wave surface incident on a photonic crystal structure of a predetermined size has a shape similar to that of plane wave.

(Influence of Propagation Distance)

Figure 5A:
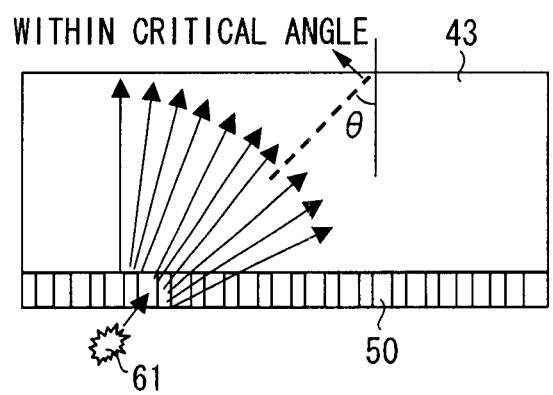
FIGS. 5A to 5C and 5A' to 5C' illustrate relationship between the propagation distance of a light flux and diffraction effect.
Figure 5A:
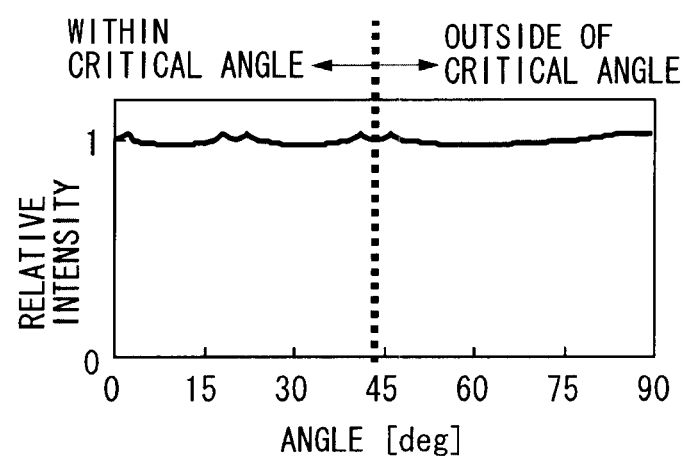
Figure 5B:
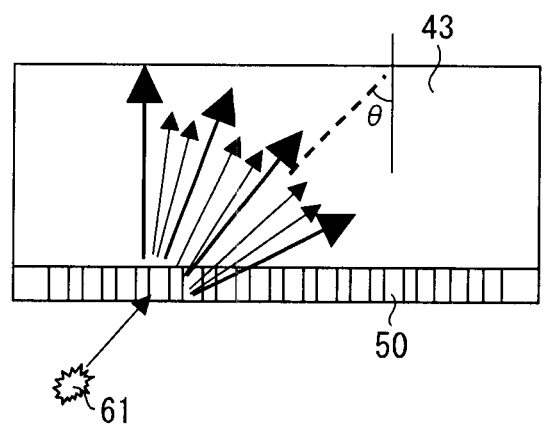
Figure 5B:
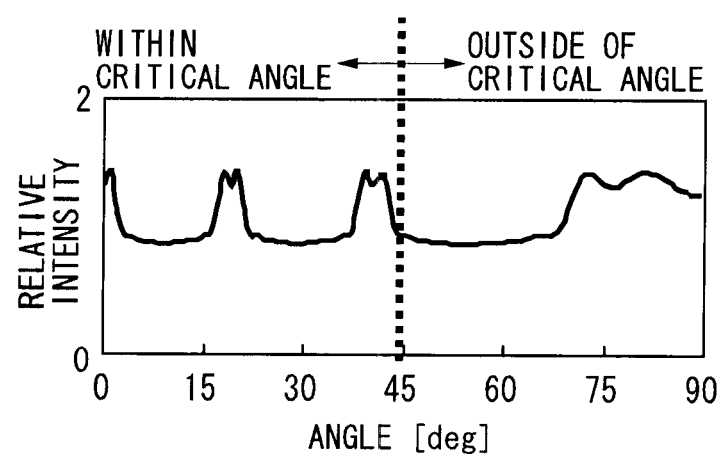
Figure 5C:
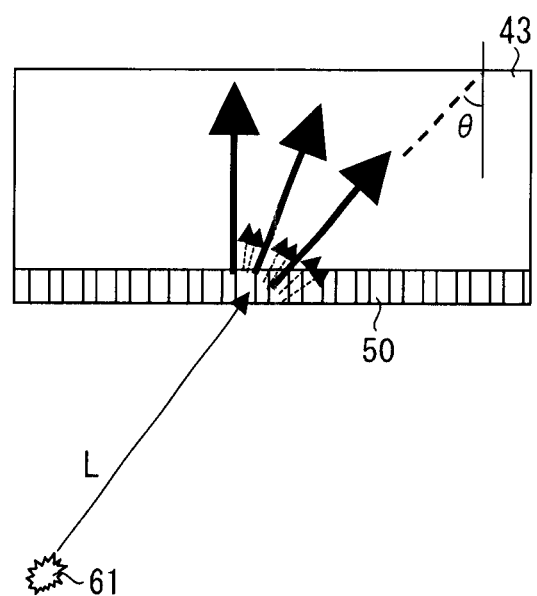
Figure 5C:
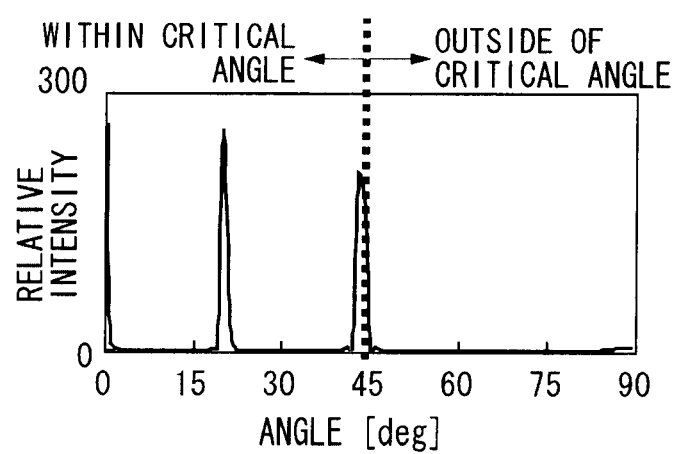

FIGS. 5A to 5C each illustrate an angular distribution of intensity of diffracted light components relative to a propagation distance of a light flux from a light emitting source to the photonic crystal structure 50, and FIG. 5A' to 5C' are graphs of the angular distribution. In FIGS. 5A to 5C, a light flux from a point light source 61 serving as a light emitting source enters the photonic crystal structure 50 and the transparent substrate 43. In FIGS. 5A' to 5C', the dashed lines each represent a critical angle θ.

FIG. 5A illustrates an angular distribution of diffracted light components in the case where a propagation distance D of a light flux from the light emitting source 61 to the photonic crystal structures 50 is relatively small. FIG. 5A' is a graph of relative intensity of light passing through the photonic crystal structures 50 in the case of FIG. 5A. Specifically, as shown in FIG. 5A' the through the photonic crystal structures 50 is almost uniformly distributed within and outside the critical angle.

In this case, the angular distribution of diffracted light components is uniform, resulting in insufficient integration of the light flux within the critical angle. In this case, the surface wave incident on a diffraction plane is spherical, resulting in non-uniform phase differences between gratings. Consequently, the photonic crystal structure 50 seems to be operating not as a diffraction grating but as a simple scattering member.

FIG. 5B illustrates the case where a propagation distance D of a light flux from the light emitting source 61 to the photonic crystal structures 50 is larger than that in FIG. 5A. FIG. 5B' is a graph of relative intensity in the case of FIG. 5B. Unlike the case in FIGS. 5A and 5A", in FIG. 5B', the angular distribution of diffracted light components exhibits higher and more defined peaks within the critical angle that outside of the critical angle, but the differences between the peaks are still not large enough to integrate all of the light flux within the critical angle.

FIG. 5C and FIG. 5C" illustrate the case where a propagation distance D of a light flux from the light emitting source 61 to the photonic crystal structures 50 is larger than that in FIG. 5B. Specifically, the propagation distance D is 100 μm or more.

In this case, the angular distribution of diffracted light components exhibits distinct differences in peaks. The differences between the peaks are large enough to integrate the light flux within the critical angle, and the luminance is increased. In this case, the surface wave incident on the diffraction plane is almost planar, and the phase differences between the gratings are uniform. Hence, the photonic crystal structure 50 seems to be operating well as a diffraction grating.

Therefore, it is evident that a longer propagation distance D of a light flux from a light emitting source to a photonic crystal structure increases the diffraction effect of the photonic crystal structure 50, and prevents decrease in luminance.
(Configuration Having Smaller Region Area of Photonic Crystal Structure)

A specific configuration to increase the propagation distance D of a light flux from the light emitting source 61 to a photonic crystal structure 50 is described with reference to FIG. 6.

Figure 6:
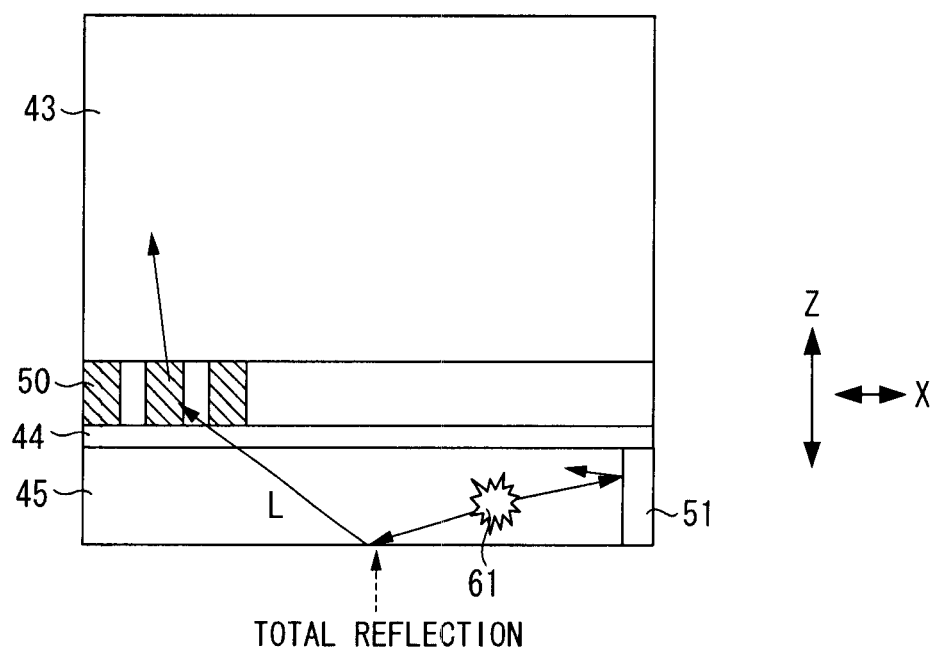
FIG. 6 illustrates the relationship between guided wave of a light flux and area of photonic crystal structure.

FIG. 6 schematically illustrates a portion of substrate 43 in FIG. 1A. FIG. 6 illustrates the relationship between a light flux L propagating through the phosphor layer 45 and the size of the portion where the photonic crystal structure 50 is formed.

The propagation distance D can be increased by simply increasing the thickness of the substrate 43 in the z direction perpendicular to the interface between the substrate 43 and the photonic crystal structures 50, in other words, by increasing the thickness of the phosphor layer 45. This approach, however, requires a 100-μm-scale increase in distance for improving the diffraction effect. This increase in thickness of the phosphor layer 45 is inappropriate in terms of efficiency in use of phosphor material and efficiency of manufacturing process of the phosphor layer 45.

Thus, in the present invention, without increase in thickness of the phosphor layer 45, the propagation distance D is increased in the direction along the interface between the substrate 43 and the photonic crystal structures 50 (i.e., in the direction parallel to the interface).

In this case, if the phosphor layer 45 is almost clear and has a low dispersion (a diffuse reflectance of 0.04% or less), the propagation distance D is eventually increased. This is because, as illustrated in FIG. 6, a light flux emitted from the light emitting source 61 away from a position directly underneath of the diffractive region of the photonic crystal structure 50 is reflected by the side, upper, and lower faces of the phosphor layer 45 with little leakage, and is guided through the phosphor layer 45.

The side faces of the phosphor layer 45 are the end surfaces of the phosphor layer 45 in the X direction in FIG. 6, whereas the upper and lower faces are the end surfaces of the phosphor layer 45 in the Y direction in FIG. 6. After guided through the phosphor layer 45, the light flux reaches the diffractive region of the photonic crystal structure 50. As a result, the propagation distance D is effectively increased.

The leakage means that the light flux L passes through the interfaces at each surface of the phosphor layer 45 and output outside the phosphor layer 45.

An increase in the region area of the phosphor layer 45 so as to increase the propagation distance D is inappropriate in terms of limitation on the range of electron beam irradiation.

Thus, the photonic crystal structure 50 (the diffractive region of the photonic crystal structure 50) may desirably have a smaller region area not larger than the region area of the phosphor layer 45. In other words, the phosphor layer 45 maintains its absolute region area, which becomes relatively larger than that of the photonic crystal structure 50 (the diffractive region of the photonic crystal structure 50), so that the propagation distance D can be increased.

Accordingly, a structure where the photonic crystal structure 50 (the diffractive region of the photonic crystal structure 50) has a region area relatively smaller than that of the phosphor layer 45 provides an improved diffraction effect. This results in increase in light-emission luminance from the phosphor layer 45 to the outside of the transparent substrate 43.
(Parameters)

The parameters that influence the guidance efficiency of the light flux L through the phosphor layer 45 are the low dispersion of the phosphor layer 45 and the reflectance of the side reflecting member 51. To prevent leakage of the light flux L during its guidance through the phosphor layer 45, it is important to prevent scattering of the light flux L in the z direction in FIG. 6.

It is also important to cause the light flux L to travel to the outer side of the phosphor layer 45, that is to move away from the center of the phosphor layer 45 in the x direction in FIG. 6, to be reflected by the side face S at a high reflectance to return to the inside of the phosphor layer 45, that is, toward the center of the phosphor layer 45.

Accordingly, the following three parameters are important to increase luminance by appropriate guidance of the light flux L through the phosphor layer 45 and the diffraction effect of the photonic crystal structure 50: the size of an area a (%) of the photonic crystal structure 50 relative to the size of a region area of the phosphor layer 45; a diffuse reflectance b (%) of the phosphor layer 45; and a reflectance c (%) of the side reflecting member 51.

Figure 9:
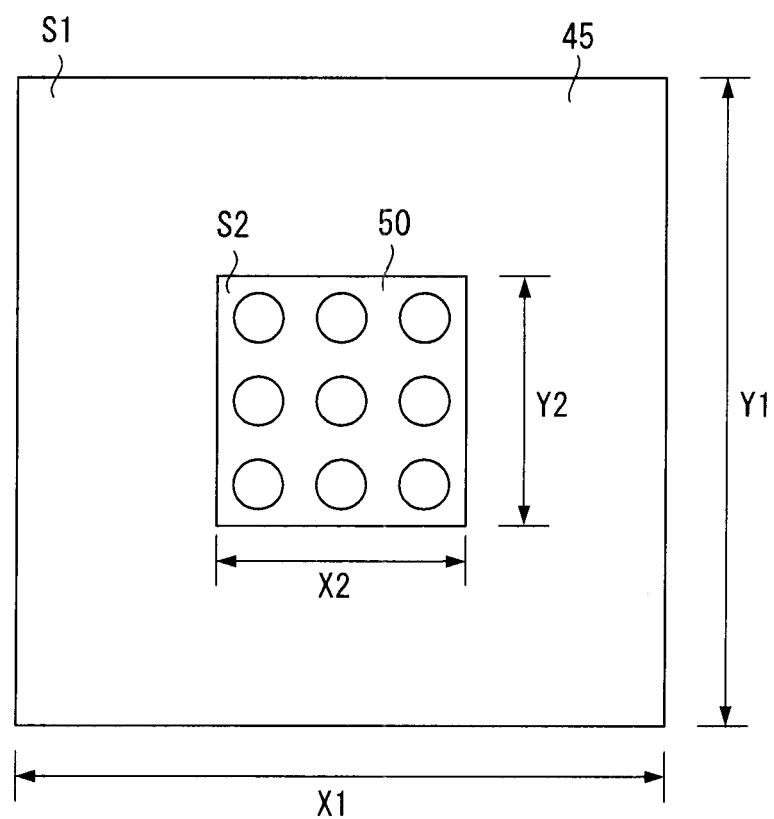
FIG. 9 illustrates a graphical definition of a relative area "a".

Definition of the relative area "a" is described with reference to FIG. 9. FIG. 9 is a schematic plan view illustrating the phosphor layer 45 and the photonic crystal structures 50 as seen from the transparent substrate 43 side. For simplicity, the transparent substrate 43, the anode 44, the black matrix 48, and the side reflecting member 51 shown in FIG. 1A are not illustrated in FIG. 9.

In FIG. 9, the phosphor layer 45 has a region area S1, and the photonic crystal structure 50 has a region area S2. More specifically, the region area S2 corresponds to the region area of the "diffractive region" of the photonic crystal structure 50. Accordingly, when the photonic crystal structure 50 in FIG. 1A is seen from the side of the transparent substrate 43 side, the outer edge of the photonic crystal structure 50 is contained within the outer edge of the phosphor layer 45.

For ease of description, in FIG. 9, both of the region of the phosphor layer 45 and the "diffractive region" of the photonic crystal structure 50 are each illustrated as a parallelogram that looks almost as a square. Both regions, however, may have any shape. The phosphor layer 45 and the "diffractive region" of the photonic crystal structure 50 are generally set to have a rectangular shape (Y1>X1) and (Y2>X2) respectively.

As illustrated in FIG. 9, the rectangular phosphor layer 45 has a region area S1=X1×Y1 where X1 for shorter side length and Y1 for longer side length, whereas the "diffractive region" of the photonic crystal structure 50 has a region area S2=X2×Y2. The relative area a can be defined based on a ratio of the region area of the "diffractive region" of the photonic crystal structure 50 to the region area of the phosphor layer 45: a=S2/S1.

Figure 7A:
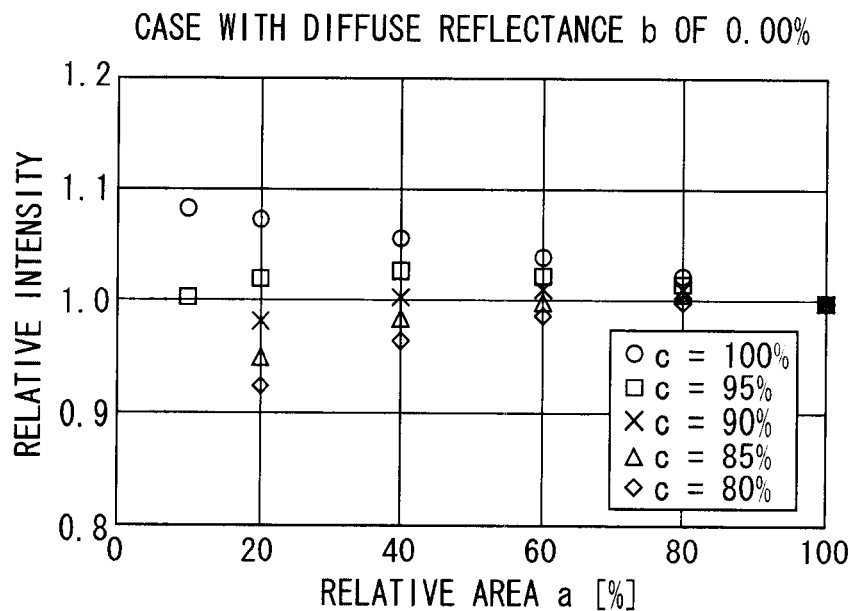
FIGS. 7A and 7B illustrate the relationship between diffuse reflectance of a phosphor layer, reflectance of a side face, relative area of a photonic crystal structure, and relative intensity.
Figure 7B:
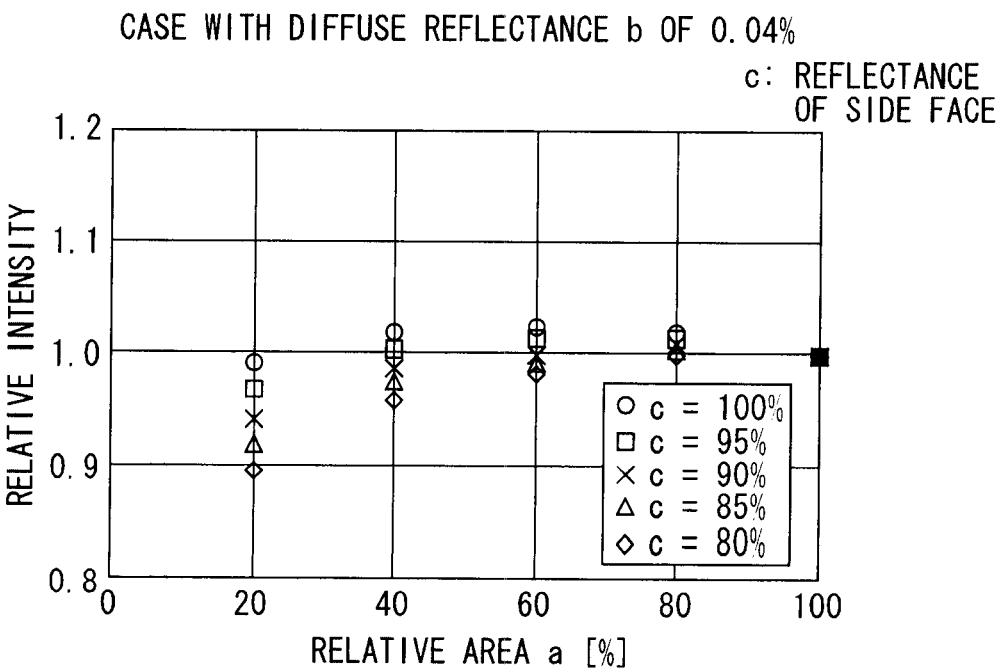

Based on these parameters a, b, and c, when the region area S2 of the "diffractive region" of the photonic crystal structure 50 is equal to the region area S1 of the phosphor layer 45 (which is referred to as normal area), the luminance changes as illustrated in FIGS. 7A and 7B.

The diffraction characteristics of the photonic crystal structures 50 may be calculated using transfer matrix method that is an approach of electromagnetic field analysis. The propagation of the light flux L through the phosphor layer 45 and the transparent substrate 43 may be calculated using a ray tracing technique. Specifically, the ray tracing technique can be achieved by illumination design and analysis software, such as LightTools (by Optical Research Associates).

FIG. 7A illustrates the case with a diffuse reflectance b of 0.00%, and FIG. 7B illustrates the case with a diffuse reflectance b of 0.04%. The horizontal axis represents relative area a, and the vertical axis represents relative luminance to the luminance of the normal area which is 1. The mark groups in FIGS. 7A and 7B indicate a side-face reflectance c of 100%, 95%, 90%, 85%, and 80%, respectively.

Figure 8:
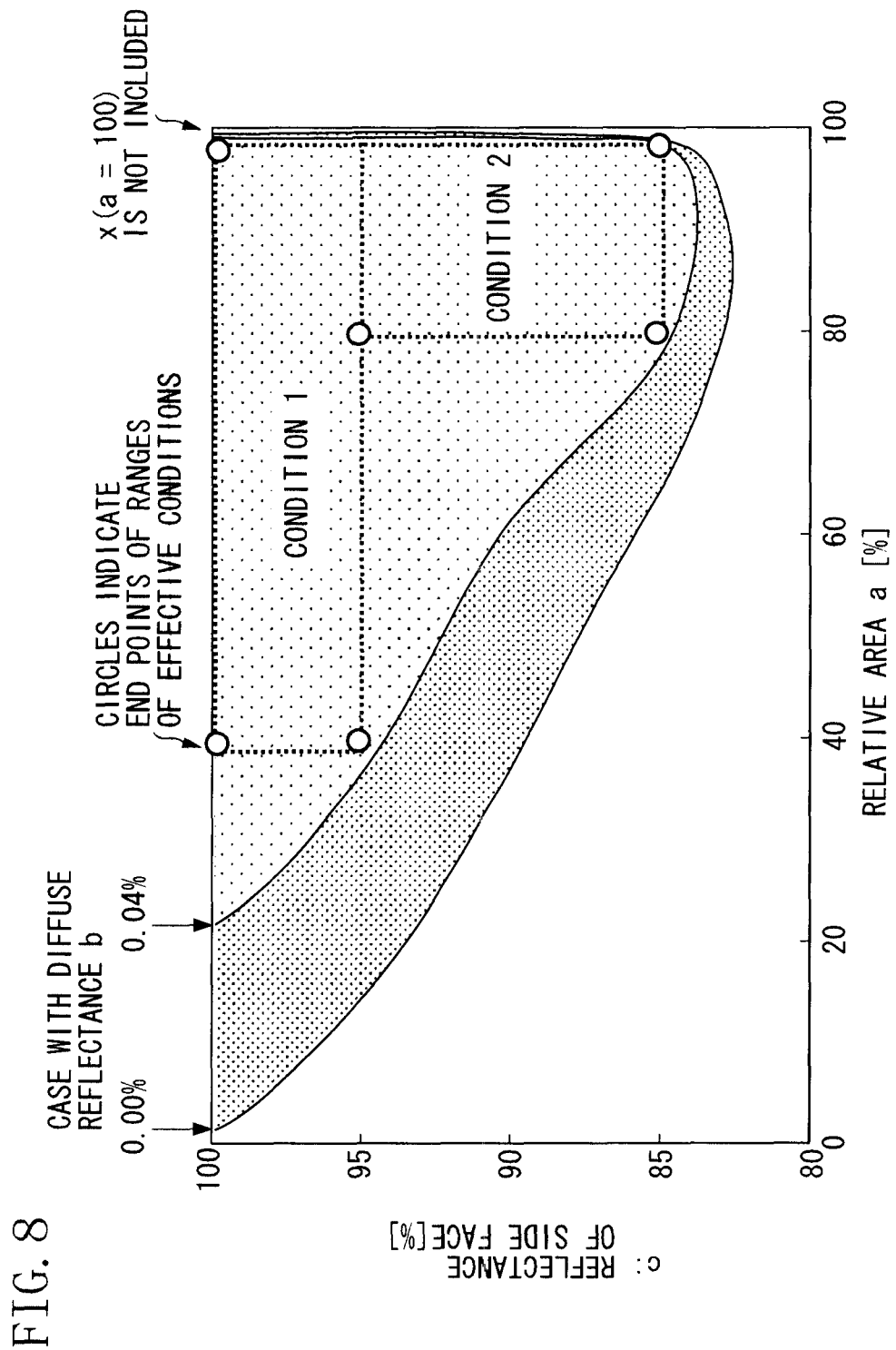
FIG. 8 illustrates an effective range of a parameter "a" and a parameter "c", in accordance with at least one embodiment of the present invention.

FIG. 8 illustrates effective ranges of parameters a, b, and c when the relative luminance is larger than that of the normal area. In FIG. 8, the horizontal axis represents relative area a, and the vertical axis represents reflectance c of the side reflecting member 51, and includes contours for diffuse reflectance b of the phosphor layer 45. FIG. 8 indicates that the effective range when the diffuse reflectance b is 0.00% is larger than that when the diffuse reflectance b is 0.04%.

The above results shows that the relative luminance larger than that of the normal area can be obtained when the diffuse reflectance b is 0.04% or less and the following Condition 1 or Condition 2 is satisfied.

(Condition 1) The side reflecting member 51 has the reflectance c of 95% or more, and the relative area "a" from 40% to less than 100%.

(Condition 2) The side reflecting member 51 has the reflectance c from 85% to less than 95%, and the relative area "a" from 80% to less than 100%.

These conditions are desirable because the phosphor layer 45 has a diffuse reflectance b of a relatively large range, and can be easily manufactured. Condition 1 is set to obtain larger effect of improved luminance, whereas Condition 2 is set to obtain a relatively large range of reflectance of the side reflecting member 51, which can make the manufacture of the reflecting member 51 easier. Accordingly, the values satisfying the conditions provide higher luminance as compared with that of the photonic crystal structures 50 of the normal area.

The display having a photonic crystal structure satisfying Condition 1 or Condition 2 can provide high luminance images.

When the light emitting substrate illustrated in FIG. 1A is used in an organic EL display, the phosphor layer 45 serving as a phosphor layer is replaced with an organic electroluminescence (EL) layer, and a cathode is provided on the organic EL layer (on the upper side of the layer in FIG. 1A). In other words, the cathode can be provided on the side of the organic EL layer opposite to the anode.

For low-molecular weight organic EL display, desirably, an electron transport layer is disposed between the light emitting layer and the cathode, and a hole transport layer is disposed between the light emitting layer and the anode 44. For high-molecular weight organic EL display, desirably, an electron transport layer is disposed between the light emitting layer and a cathode, and a conducting polymer layer is disposed between the light emitting layer and the anode 44.

FIG. 1A illustrates the light emitting substrate according to a first exemplary embodiment. In FIG. 1A, the light emitting substrate includes a transparent substrate 43, an anode 44, a phosphor layer 45, a black matrix 48, a side reflecting member 51, and a photonic crystal structure 50, which are described in detail below.

A cobalt oxide was deposited on the transparent substrate 43 by sputtering technique. On the cobalt oxide, the black matrix 48 having rectangular openings was patterned using resist to form the photonic crystal structures 50. The rectangular openings each had a size of 100 µm×200 µm.

Subsequently, on the transparent substrate 43 having the black matrix 48, a $TiO_2$ film was deposited by the sputtering technique. In the present exemplary embodiment, the transparent substrate 43 was a glass substrate having a refractive index of 1.55. The $TiO_2$ film had a refractive index of 2.2, and a thickness of 1.3 µm. The $TiO_2$ film was coated with a resist film.

The resist film was subjected to exposure and development by an exposure apparatus, to form, in the resist film, an opening pattern corresponding to the fine dots 52 illustrated in FIG. 1B. The opening pattern was formed to obtain the fine dots 52 arranged at a pitch p of 1700 nm and each having a diameter w of 1200 nm.

The photonic crystal structure 50 had a diffractive region (that corresponds to the region area S2 described above with reference to FIG. 9) having a long side of 126 µm for the side Y2 in FIG. 9 and a short side of 63 µm for the side X2 in FIG. 9 to obtain a relative area a covering 40% of the surface of the photonic crystal structure 50. The diffractive region was positioned to have a center aligned with the center of an opening of the black matrix.

The $TiO_2$ film was etched by reactive ion etching using the resist as a mask to form openings in the $TiO_2$ film. The resist film was then removed using a resist stripper.

Thereafter, a polysilazane-based coating solution was applied to the $TiO_2$ film by spin coating, which was fired to form amorphous $SiO_2$, so that the openings formed in the $TiO_2$ film were filled with $SiO_2$ to obtain the photonic crystal structure 50 composed of the $TiO_2$ film having a plurality of fine dots 52 of $SiO_2$. In this way, the transparent substrate 43 having the photonic crystal structure 50 in each pixel region was produced.

The photonic crystal structure 50 was then deposited with an ITO film as the anode 44 by sputtering technique to a thickness of 100 nm to cover the photonic crystal structure 50 with the ITO film.

The ITO film 44 was formed to have an area larger than that of the opening of the black matrix, and kept the outer edge of the ITO film 44 outside of opening of the black matrix. The ITO film had a refractive index of 1.9.

In FIG. 1A, the anode 44 covers part of the upper surface of the black matrix, but the anode may entirely cover the upper surface of the black matrix.

A thin film phosphor was then laminated on the anode 44 to form the phosphor layer 45 by sputtering technique. In The present exemplary embodiment, the thin film phosphor composed of $Y_2O_2S$:Eu for red light emission was deposited to a thickness of 1 μm over the ITO film 44.

The phosphor layer 45 was coated with a resist film, which was subjected to exposure and development to form a pattern (the same pattern as that of the openings of the black matrix 48) having the size corresponding to each of the pixels. The pixels have a rectangular shape of 200 μm×100 μm.

Part of the phosphor layer 45 where the resist film was not covered is removed by RIE using the resist as a mask, to form the side face S of the phosphor layer 45 so that the side face is to be perpendicular to the substrate. In this way, the phosphor layer 45 was obtained.

The phosphor layer 45 had a diffuse reflectance of 0.01%. The diffuse reflectance was measured according to the approach described above in the exemplary embodiment. In other words, the region outside the diffractive region of the photonic crystal structure 50 (the region adjacent to the diffractive region) that is located in an opening of the black matrix 48 was measured.

An illumination light flux was projected to the phosphor layer 45 to illuminate the region adjacent to the diffractive region from the side of the transparent substrate 43 at an angle of 45° relative to the normal line that is perpendicular to the surface of the photonic crystal structure 50 of the transparent substrate 43. The light flux was reflected and received on the normal line (at an angle of 0°).

The intensity of the received light was calculated with that obtained in the same measurement system using a standard white surface, to obtain a ratio of intensity as a diffuse reflectance. The measurement was performed using a halogen light source, MHAA-100W-100V (by MORITEX Corporation), as illumination light source, a spectral radiometer, SR-UL1 (by TOPCON TECHNOHOUSE Corporation), as light receiver, and a standard white board, WS-3 (by TOPCON TECHNOHOUSE Corporation), as standard white surface.

While the resist remained on the phosphor layer 45, silver was deposited on the side of the phosphor layer 45 by vacuum deposition technique to form the side reflecting member 51 of 100 nm. The resist was then removed by a resist stripper from the phosphor layer 45 to obtain the side reflecting member 51. The silver used to form the side reflecting member 51 was deposited similarly on another glass substrate to form another film of 100 nm, which was found to have a reflectance of 98%.

The reflectance was measured according to the approach described above in the exemplary embodiment. In other words, a light flux was projected to illuminate the silver film from the side of the glass substrate at an angle of +5° relative to the normal line that is perpendicular to the surface of silver film on the glass substrate. The light flux was reflected and received at an angle of −5° relative to the normal line. The intensity of the received light was calculated with that obtained in the same measurement system using a standard mirror, to obtain a ratio of intensity as a reflectance. The measurement was performed using a spectrophotometer of SolidSpec3700 (by Shimadzu Corporation).

As described above, a light emitting substrate satisfying Condition 1 was obtained, and was measured for a light-emission luminance using a luminance evaluation vacuum system.

Specifically, the light emitting substrate was placed in a vacuum apparatus for evaluating luminance. In the apparatus, electrons were emitted from an electron gun in a vacuum. The electrons were accelerated by an acceleration voltage applied between the anode 44 and the electron gun to be projected to the phosphor layer 45.

The light-emission luminance of the phosphor layer 45 was measured, through the transparent substrate 43 and a glass window of the vacuum apparatus, by a luminance meter. The vacuum system was maintained at a degree of vacuum of $1\times10^{-6}$ Pa for luminance evaluation, and a voltage of 7 kV was applied between the anode 44 and the electron gun. The electron gun emitted an electron beam of 40 μA, which was focused to a diameter of 1 mm on the phosphor layer 45 to provide a current density of 4 $mA/cm^2$.

The resultant phosphor layer 45 emitted red light, the light-emission luminance of which was found to be 366 $cd/m^2$.

A large number of pixels having the above described configuration were arranged in a matrix on a glass substrate to obtain a face plate 46. The face plate 46, a rear plate 41 having the electron-emitter devices 34, and a support frame 42 were assembled to obtain an image display apparatus illustrated in FIG. 2. The electron-emitter devices 34 used were surface-conduction electron-emitter devices.

The image display apparatus had a luminance of 30.2 $cd/m^2$ when only red pixels were turned on. The light-emission luminance of the present exemplary embodiment was larger than that of later-described Comparative the present exemplary embodiment by 4.5%.

A comparative exemplary embodiment differs from the first exemplary embodiment in that the diffractive region of the photonic crystal structure 50 covers the entire pixel region (the openings of the black matrix were covered with diffractive regions), i.e., the diffractive region of the photonic crystal structure 50 had the same size as that of the phosphor layer 45.

Thus, in the comparative exemplary embodiment, the relative area a covered 100% of the surface of the photonic crystal structure 50. The other configuration of the comparative exemplary embodiment is similar to that of the first exemplary embodiment. The light emitting substrate produced under such condition was measured for light-emission luminance, which was found to be 350 $cd/m^2$.

A large number of pixels having the configuration of the comparative exemplary embodiment were arranged in a matrix on a glass substrate to obtain a face plate 46. The face plate 46 was assembled as in the first exemplary embodiment to obtain an image display apparatus. The image display apparatus had a luminance of 28.9 $cd/m^2$ when only red pixels were turned on.

A second exemplary embodiment satisfies Condition 1, and is similar to the first exemplary embodiment except that the phosphor layer 45 was made of nanoparticle fluorescent material. The other configuration of the present exemplary embodiment is similar to that of the first exemplary embodiment, and not described. The phosphor layer 45 of nanoparticle fluorescent material was formed as follows.

A method of manufacturing phosphor particles of according to the present exemplary embodiment is described. In the present exemplary embodiment, the nanoparticle fluorescent material particles were produced using sol-gel method in liquid-phase techniques.

Nanoparticle phosphor for red light emission can be formed in such a manner that an oxide such as $Y_2O_3$ and $Gd_2O_3$ or a sulfide such as $Y_2O_2S$ is prepared as a host material, and an activator metal such as Eu and Zn are added thereto.

An inorganic salt of yttrium (y) or Gd, an inorganic salt of Eu, an inorganic salt of Zn, and an organic acid are dissolved or dispersed in a solvent. The solution or dispersion is heated and gelled (in a sol-gel method).

The resultant is fired in an atmosphere containing oxygen (e.g., the air). When the oxide is heated in an atmosphere containing hydrogen sulfide, a sulfide $Y_2O_2S$ can be obtained.

The inorganic salt of yttrium and that of Gd may be any compound that decomposes and becomes an oxide by firing. Examples of the compound include nitrates, carbonates, oxalates, sulfates, acetates, hydroxides, and halides (e.g., chlorides and bromides).

Examples of the inorganic salts of Eu and Zn include nitrates, carbonates, oxalates, sulfates, acetates, hydroxides, and halides (e.g., chlorides and bromides).

In the present exemplary embodiment, the nanoparticle fluorescent material of $Y_2O_2S$:Eu for red light emission was produced using the sol-gel method. The particles were measured for particle size distribution, and found to have a mean diameter of 21 nm. The mean diameter of the phosphor particles was measured using Zetasizer Nano ZS (by SYSMEX Corporation). The mean diameter corresponds to a median value (D50) in volume distribution.

The nanoparticle fluorescent material obtained using the sol-gel method was put into a ball mill for solvent dispersion. The solvent used was isopropyl alcohol (IPA), and the dispersing agent used was an acrylic dispersant. Subsequently, to impart viscosity and surface tension suitable to bar coating technique, solvent displacement technique in butyl carbitol acetate (BCA) was used to prepare ink containing the nanoparticle fluorescent material and used in bar coating technique.

To form the phosphor layer 45, the ITO film 44 was formed as an anode, to which the ink containing the nanoparticle fluorescent material having a mean diameter of 21 nm was applied by bar coating technique. The product was fired for 1 hour at a temperature of 550 degrees C. The phosphor layer 45 after firing had a thickness of 1000 nm. The other configuration and production method of the present exemplary embodiment are the same as those in the first exemplary embodiment, which will not be described.

The phosphor layer 45 was measured for diffuse reflectance in the same manner as in the first exemplary embodiment, and was found to have a diffuse reflectance of 0.04%. The light emitting substrate produced as described above was measured for light-emission luminance in the same manner as in the first exemplary embodiment, and was found to have a light-emission luminance of 359 $cd/m^2$. An image display apparatus was fabricated as in the first exemplary embodiment, which was measured for luminance, and was found to have a luminance of 29.6 $cd/m^2$ when only red pixels were turned on. The light-emission luminance of the present exemplary embodiment was larger than that of a second comparative exemplary embodiment to be described below by 1.4%.

A second comparative exemplary embodiment differs from the second exemplary embodiment in that the diffractive region of the photonic crystal structure 50 covers the entire pixel region (the openings of the black matrix were covered with diffractive regions), therefore in the second comparative exemplary embodiment, the relative area a covered 100% of the surface of the photonic crystal structure 50. The other configuration and the production method are the same as those in the second exemplary embodiment.

The light emitting substrate produced as described above was measured for light-emission luminance in the same manner as in the first exemplary embodiment, and was found to have a light-emission luminance of 354 $cd/m^2$. An image display apparatus was fabricated as in the second exemplary embodiment, which was found to have a luminance of 29.2 $cd/m^2$ when only red pixels were turned on.

A third exemplary embodiment satisfied Condition 2, and differs from the second exemplary embodiment in that the side reflecting member 51 was made of aluminum, and that the diffractive region of the photonic crystal structure 50 covers 80% of the pixel region (80% of the openings of the black matrix were covered with diffractive regions of the photonic crystal structure 50). In the second comparative exemplary embodiment, the relative area a covered 100% of the surface of the photonic crystal structure 50. For the rest, the light emitting substrate of the present exemplary embodiment was produced in a similar manner to that of the first exemplary embodiment.

The light emitting substrate produced as described above was measured for light-emission luminance in the same manner as in the first exemplary embodiment, and was found to have a light-emission luminance of 356 $cd/m^2$. An image display apparatus was fabricated as in the first exemplary embodiment, which was found to have a luminance of 29.4 $cd/m^2$ when only red pixels were turned on. The light-emission luminance of the present exemplary embodiment was larger than that of a third comparative exemplary embodiment by 0.7%.

The third comparative exemplary embodiment differs from the third exemplary embodiment in that the diffractive region of the photonic crystal structure 50 covers the entire pixel region (the openings of the black matrix were covered with diffractive regions). Therefore, in the comparative exemplary embodiment, the relative area a covered 100% of the surface of the photonic crystal structure 50. For the rest, the light emitting substrate of the third comparative exemplary embodiment was produced in a similar manner to that of the third exemplary embodiment.

The light emitting substrate produced as described above was measured for light-emission luminance in the same manner as in the first exemplary embodiment, and was found to have a light-emission luminance of 353 $cd/m^2$. An image display apparatus was fabricated as in the third exemplary embodiment, which was found to have a luminance of 29.2 $cd/m^2$ when only red pixels were turned on.

While the present invention has been described with reference to exemplary embodiments and specific examples, it is to be understood that the invention is not limited to those. The scope of the following claims is to be accorded the broadest interpretation so as to encompass all modifications, equivalent structures, and functions.

This application claims priority from Japanese Patent Application No. 2010-133288 filed Jun. 10, 2010, which is hereby incorporated by reference herein in its entirety.

What is claimed is:

1. A light emitting substrate, comprising:
   a transparent substrate;

a photonic crystal structure;
a transparent anode;
a light emitting layer having a diffuse reflectance of 0.04% or less and having a side reflecting member at a side thereof,
wherein the photonic crystal structure, the transparent anode, and the light emitting layer are successively laminated in this order on the transparent substrate,
wherein the light emitting substrate satisfies the following Condition 1 or Condition 2:
Condition 1: $95\% \leq c$, and $40\% \leq a < 100\%$
Condition 2: $85\% \leq c < 95\%$, and $80\% \leq a < 100\%$
where parameter "a" represents a relative area defined based on a ratio of an area S2 of a diffractive region of the photonic crystal structure to an area S1 of the light emitting layer such that the parameter a=S2/S1, and parameter "c" represents a reflectance of the side reflecting member.

2. The light emitting substrate according to claim 1, wherein the reflectance of the side reflecting member satisfies Condition 1 or Condition 2, when light incident on the photonic crystal structure is incident thereupon at an angle less than the critical angle.

3. The light emitting substrate according to claim 1, wherein the side reflecting member is disposed on a side of the light emitting layer that is perpendicular to the transparent substrate.

4. The light emitting substrate according to claim 1, wherein the relative area represented by the parameter "a" is defined such that an outer edge of the area S2 is contained within an outer edge of the area S1.

5. The light emitting substrate according to claim 1, wherein the light emitting layer includes a thin film of a phosphor layer or integration of nanoparticles.

6. An image display apparatus including the light emitting substrate according to claim 1.

7. The image display apparatus according to claim 6, wherein the image display apparatus is an organic electroluminescence display, and
the image display apparatus further comprising:
a hole transport layer interposed between the anode and the light emitting layer;
a cathode disposed on the light emitting substrate on the side opposite to the anode and interposing an electron transport layer therebetween.

8. The image display apparatus according to claim 6, wherein the image display apparatus is an organic electroluminescence display, and
the image display apparatus further comprising:
a conductive polymer layer interposed between the anode and the light emitting layer; and
a cathode disposed on the light emitting layer on the side opposite to the anode.

9. The image display apparatus according to claim 6, wherein the image display apparatus is a field emission display (FED).

10. The light emitting substrate according to claim 1, wherein the area S1 of the light emitting layer is larger than the area S2 of the diffractive region of the photonic crystal structure.

* * * * *